United States Patent
Tseng et al.

(10) Patent No.: US 7,304,854 B2
(45) Date of Patent: Dec. 4, 2007

(54) HEAT DISSIPATING DEVICE FOR ELECTRONIC COMPONENT

(75) Inventors: Richard Tseng, Fullerton, CA (US);
Rong-Che Chen, Tu-Cheng (TW);
Yih-Jong Hsieh, Tu-Cheng (TW);
Chien-Yi Lo, Tu-Cheng (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 314 days.

(21) Appl. No.: 11/107,039

(22) Filed: Apr. 15, 2005

(65) Prior Publication Data

US 2006/0232943 A1   Oct. 19, 2006

(51) Int. Cl.
*H05K 7/20* (2006.01)

(52) U.S. Cl. .................. 361/719; 361/704; 361/710; 165/80.3; 165/185; 257/706; 174/16.3

(58) Field of Classification Search ............. None
See application file for complete search history.

(56) References Cited

U.S. PATENT DOCUMENTS

| | | | |
|---|---|---|---|
| 4,415,025 A | | 11/1983 | Horvath |
| 5,991,155 A | * | 11/1999 | Kobayashi et al. ......... 361/705 |
| 6,034,874 A | * | 3/2000 | Watanabe ................... 361/704 |
| 6,049,469 A | * | 4/2000 | Hood et al. ................. 361/818 |
| 6,055,158 A | * | 4/2000 | Pavlovic .................... 361/704 |
| 6,337,796 B2 | * | 1/2002 | Yamada et al. ............. 361/719 |
| 6,583,986 B1 | * | 6/2003 | Storti et al. ................. 361/704 |
| 6,587,345 B2 | * | 7/2003 | Chu et al. ................... 361/719 |
| 6,696,643 B2 | * | 2/2004 | Takano ....................... 174/520 |
| 6,728,104 B1 | * | 4/2004 | Ahmad et al. .............. 361/704 |
| 6,816,377 B2 | * | 11/2004 | Itabashi et al. ............. 361/704 |
| 2005/0157469 A1 | * | 7/2005 | Gorak ......................... 361/719 |

FOREIGN PATENT DOCUMENTS

| CN | 2621311 Y | 6/2004 |
|---|---|---|
| CN | M241965 | 8/2004 |
| CN | M252250 | 12/2004 |

* cited by examiner

*Primary Examiner*—Boris Chervinsky
(74) *Attorney, Agent, or Firm*—Morris Manning Martin LLP; Tim Tingkang Xia, Esq.

(57) ABSTRACT

A heat dissipating device is used to be sandwiched between a motherboard and a chassis for transferring heat from the motherboard to the chassis. The heat dissipating device includes a body for contacting with a bottom side of the motherboard, and a plurality of wings extending from the body. Each wing includes a connecting section extending from the body and a contacting section extending further from the connecting section for contacting with the chassis. The body engages with the bottom side of the motherboard at a position corresponding to that a heat-generating electronic component is mounted to a top side of the motherboard. Heat generated by the electronic component is transferred to the chassis through the motherboard and the heat dissipating device. The heat dissipating device is formed by stamping a metal sheet with high heat conductivity.

8 Claims, 3 Drawing Sheets

HEAT DISSIPATING DEVICE FOR ELECTRONIC COMPONENT

TECHNICAL FIELD

The present invention relates to a heat dissipating device for an electronic component, and particularly to a heat dissipating device for a high-power integrated circuit (IC) chip.

BACKGROUND

As computer technology continues to advance, electronic components such as central processing units (CPUs), are made to provide faster operational speeds and greater functional capabilities. When a CPU operates at a high speed in a computer enclosure, its temperature frequently increases greatly. It is desirable to dissipate the heat generated by the CPU quickly. To solve this problem of heat generated by the CPU, in a desk top computer, a cooler (inclusive of a heat sink and a fan) is mounted on top of the CPU to dissipate heat generated thereby. In a notebook computer, a heat pipe is often used to transfer heat generated by the CPU to a place where an air flow generated by a fan takes the heat away from the notebook computer.

There are other electrical components in the computer also needed to be cooled; however since these components are too small in size, it is very difficult to use a cooler or a heat pipe to contact these components thereby to dissipate heat generated therefrom. A voltage regulator (VR) is such a component. The VR is an integrated circuit chip for regulating power and supplying it to the CPU. Following the increase of power consumed by the CPU, power regulated by the VR is increased accordingly, whereby heat generated by VR is increased significantly, which needs to be effectively dissipated so that the computer can work smoothly. Prior art technology does not teach a heat dissipating device which can effectively solve the heat problem generated by the VR or other small-sized high-power components on a motherboard in the computer.

SUMMARY

A heat dissipating device in accordance with a preferred embodiment of the present invention comprises a body for contacting with a motherboard, and a plurality of wings extending from the body for contacting with a chassis containing the motherboard to build a heat transfer path from the motherboard to the chassis. The heat dissipating device is preferable to be sandwiched between a bottom side of the motherboard and the chassis for transferring heat from the motherboard to the chassis. The heat dissipating device thermally contacts with the bottom side of the motherboard at a position corresponding to that a heat-generating electronic component is mounted to a top side of the motherboard, whereby heat generated by the electronic component is dissipated to the chassis by the heat dissipating device.

Other objects, advantages and novel features of the present invention will be drawn from the following detailed description of a preferred embodiment of the present invention with attached drawings, in which:

DETAILED DESCRIPTION OF PREFERRED EMBODIMENTS

Figure 1:
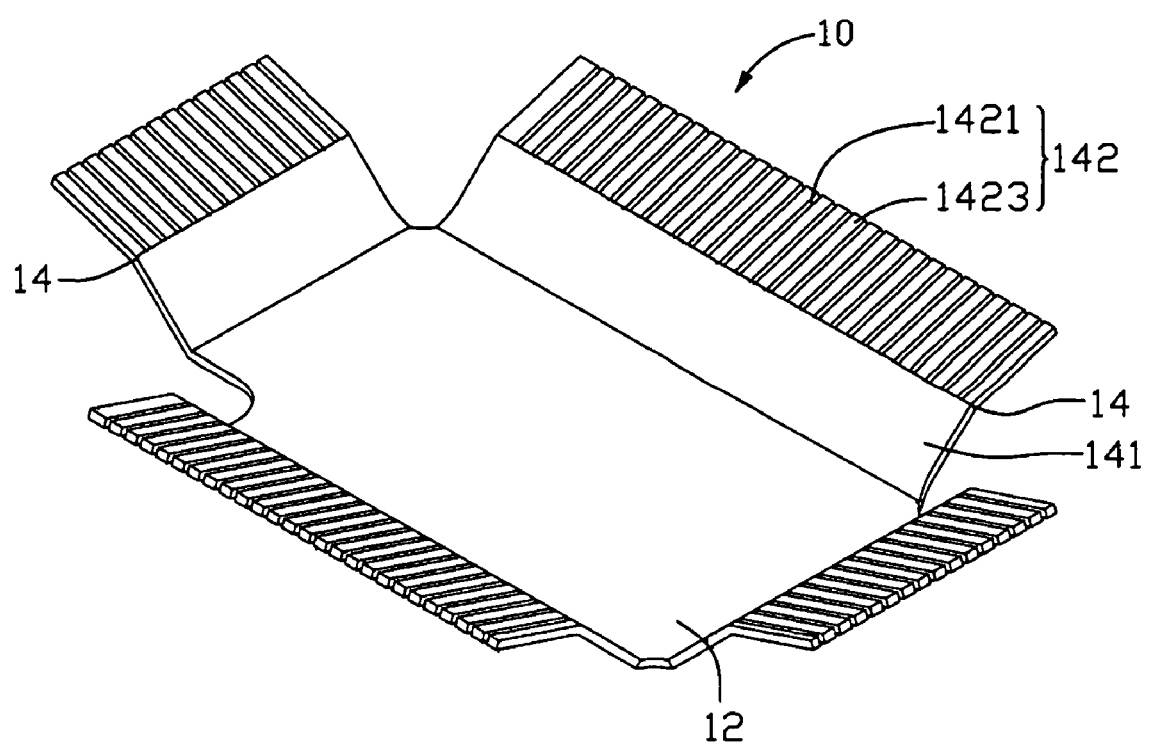
FIG. 1 is an isometric view of a heat dissipating device in accordance with a preferred embodiment of the present invention.

FIG. 1 shows a heat dissipating device 10 in accordance with a preferred embodiment of the present invention. The heat dissipating device 10 is made of material with good heat conductivity such as, copper, aluminum and so on. The heat dissipating device 10 is formed by stamping a metal sheet and comprises a rectangular body 12, and four flexible wings 14 integrally extending from corresponding four edges of the body 12 respectively. A space (not labeled) is defined between every two adjacent wings 14 to separate the two adjacent wings 14 and thereby increase the flexibility of the wings 14. Each wing 14 comprises a connecting section 141 extending slantways from a corresponding edge of the body 12, and a contacting section 142 extending further slantways from a distal edge of the connecting section 141 in a direction away from the body 12. Alternatively, the connecting section 141 and the body 12 may be perpendicular to each other and the contacting section 142 and the connecting section 141 may be perpendicular to each other. A plurality of slits 1421 is defined in the contacting section 142 to allow the contacting section 142 to form a plurality of spaced flexible fingers 1423.

Figure 2:
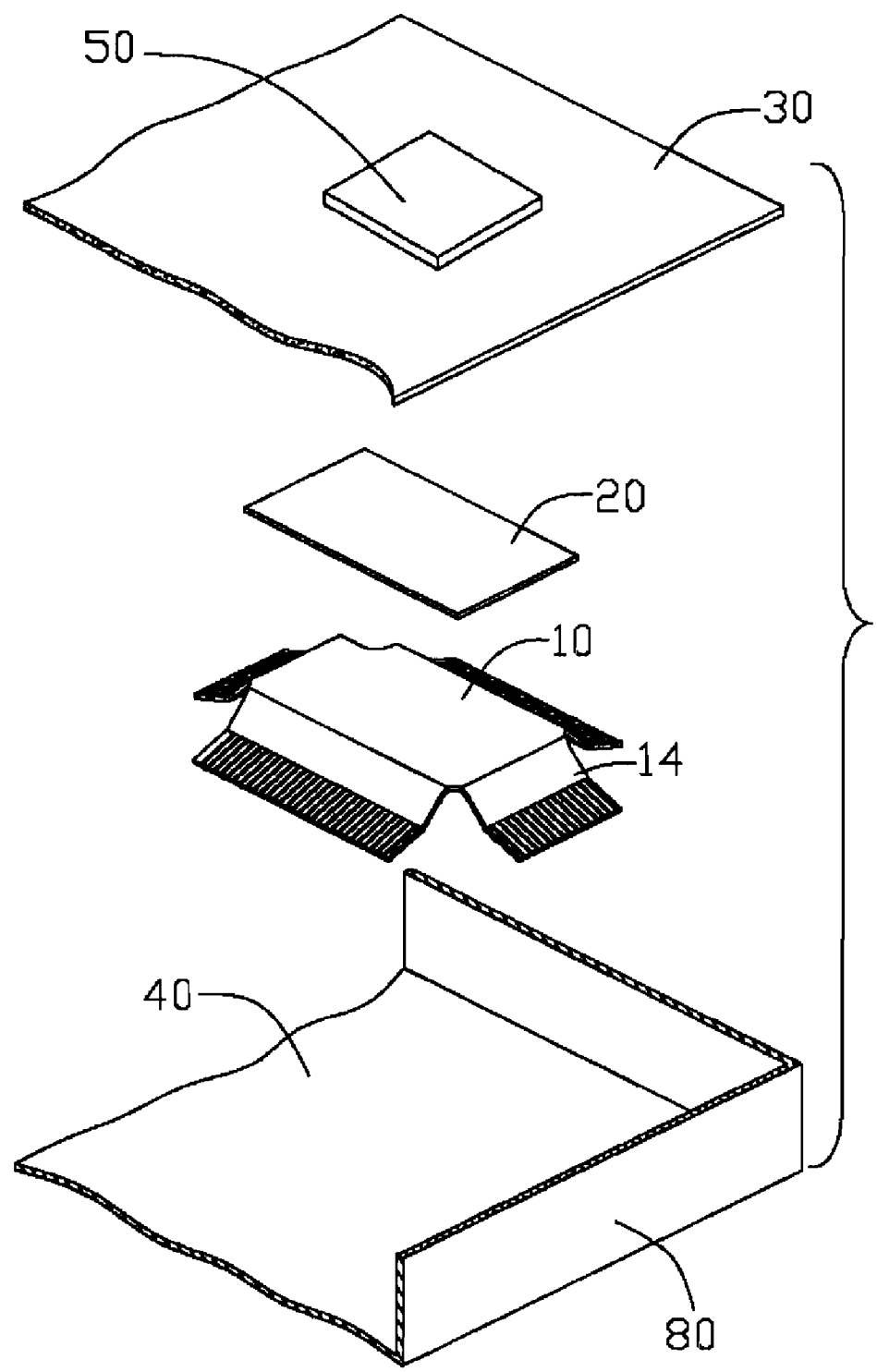
FIG. 2 is an exploded view of the heat dissipating device of FIG. 1, a motherboard and a portion of a chassis.
Figure 3:
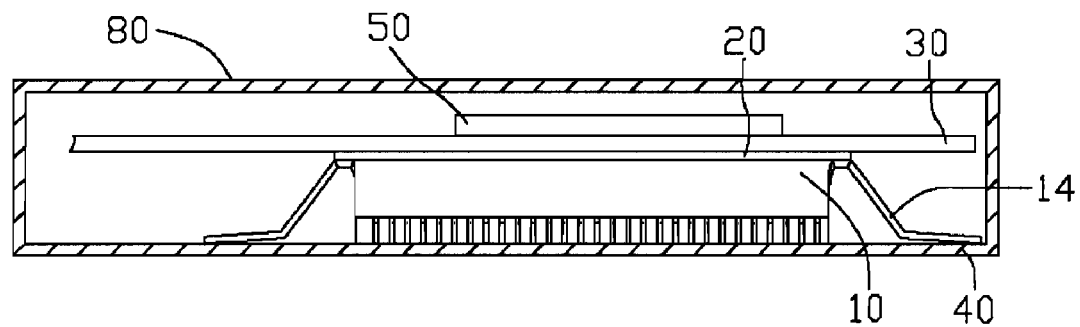
FIG. 3 is a side elevation assembled view of FIG. 2.

FIGS. 2-3 show the heat dissipating device 10 located between a motherboard 30 and a panel 40 of a metal chassis 80 of a computer. A small-sized, high-power electronic component such as a voltage regulator (VR) 50, is mounted on a top side of the motherboard 30. The heat dissipating device 10 is attached to a bottom side of the motherboard 30 at a position corresponding to that the VR 50 is mounted to the motherboard 30. A thermal pad 20 which is heat-conductive and electrically insulative is preferably applied between the body 12 of the heat dissipating device 10 and the bottom side of the motherboard 30. The thermal pad 20 may eliminate air gaps formed between the motherboard 30 and the body 12 of the heat dissipating device 10. The thermal pad 20 is also adhesive so that it can adhere the body 12 to the bottom side of the motherboard 30. The body 12 of the heat dissipating device 10 thermally contacts with the bottom side of the motherboard 30. The wings 14 are deformed and the fingers 1423 thereof firmly contact with the panel 40 of the chassis 80 after assembly of the computer.

In the preferred embodiment of the present invention described above, the wings 14 are flexible. Thus, the heat dissipating device 10 is adjustable to fit different distance formed between the motherboard 30 and the chassis 80. Furthermore, even if the panel 40 is not flat sufficiently, the engagement between the heat dissipating device 10 and the chassis 80 is not hindered since the wings 14 are flexible so that a heat transfer path between the motherboard 30 and the panel 40 of the chassis 80 can be effectively established to thereby effectively dissipate heat generated by the VR 50. Furthermore, each wing 14 has a plurality of spaced flexible fingers 1423 which can ensure a reliable engagement between the heat dissipating device 10 and the chassis 80 to thereby improve heat transferring efficiency between the heat dissipating device 10 and the chassis 80. Moreover, the body 12 of the heat dissipating device 10 is adhered to the bottom side of the motherboard 30 via the thermal pad 20. Thus, the heat dissipating device 10 does not impact the layout of the electronic components on the motherboard 30. In summary, in the present invention, the heat generated by the VR 50 is first transferred to the motherboard 30, then the thermal pad 20, then the body 12 of the heat dissipating device 10, thereafter the wings 14 of the heat dissipating device 10, and finally dissipated to the panel 40 of the chassis 80.

Figure 4:
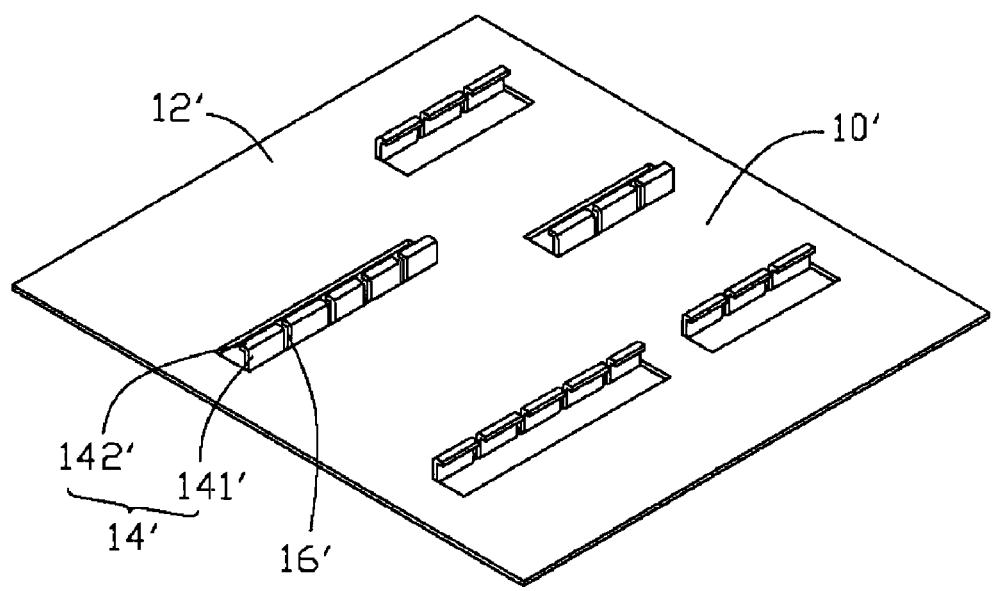
FIG. 4 is an isometric view of a heat dissipating device in accordance with an alternative embodiment of the present invention.

FIG. 4 shows a heat dissipating device 10' in accordance with an alternative embodiment of the present invention. The heat dissipating device 10' comprises a body 12' and a plurality of wings 14' integrally stamped from the body 12'. A plurality of rectangular openings (not labeled) are defined in the body 12' neighboring the wings 14'. These rectangular openings are formed due to the forming of the wings 14'. A plurality of slits 16' is defined in each wing 14' for increasing the flexibility of the wing 14'. Each wing 14' comprises a connecting section 141' extending perpendicularly from the body 12', and a contacting section 142' extending perpendicularly from the connecting section 141'. Alternatively, the contacting section 142' may extend slantways from the connecting section 141' and the connecting section may extend slantways from the body 12'. Similar to the first embodiment, in this embodiment, the body 12' is used for engaging with the bottom side of the motherboard 30 and the contacting sections 142' are used for engaging with the panel 40 of the chassis 80.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. An electronic combination comprising:
    a chassis with a panel;
    a circuit board with at least one electronic component mounted on one side thereof; and
    a heat dissipating device sandwiched between the panel and the circuit board, the heat dissipating device comprising a body thermally contacting with an opposite side of the circuit board at a position corresponding to that the at least one electronic component is mounted to the circuit board, a plurality of wings extending from the body and thermally contacting with the panel for transferring heat generated by the at least one electronic component from the circuit board to the chassis;
    wherein each of the wings comprises a plurality of spaced fingers formed at a free end thereof for contacting with the panel of the chassis; and
    wherein each of the wings comprises a connecting section perpendicularly extending from the body and a contacting section perpendicularly extending from the connecting section, a plurality of slits being defined in each of the wings.

2. A heat dissipating device for dissipating heat generated by an electronic component mounted on a first member, the heat dissipating device being made of metal and comprising:
    a body for contacting with the first member; and
    a plurality of flexible wings extending from the body for contacting with a second member to build a heat transfer path from the first member to the second member, thereby dissipating heat generated by the electronic component to the second member;
    wherein each of the wings comprises a plurality of spaced fingers formed at a free end thereof for contacting with the second member; and
    wherein each of the wings comprises a connecting section slantway extending from the body and a contacting section slantway extending from the connecting section, the fingers being formed at the contacting section.

3. The heat dissipating device as claimed in claim 2 wherein the body is rectangular-shaped and the wings extend from side edges of the body.

4. The heat dissipating device as claimed in claim 3, wherein a space is defined between every two adjacent wings to separate said two adjacent wings to thereby increase the flexibility of the wings.

5. A computer system comprising:
    a chassis;
    a circuit board contained in the chassis;
    an electronic component mounted on a top side of the circuit board;
    a heat dissipating device, via adhering means, mounted on a bottom side of the circuit board at a position corresponding to that the electronic component is mounted to the circuit board, the heat dissipating device thermally contacting with the bottom side of the circuit board and the chassis and transferring heat generated by the electronic component to the chassis;
    wherein the adhering means comprises a thermal medium sandwiched between the heat dissipating device and the bottom side of the circuit board;
    wherein the thermal medium is a thermal pad;
    wherein the heat dissipating device has a body engaging with the thermal pad and a plurality of flexible wings extending downwardly from the body and engaging with the chassis; and
    wherein the flexible wings each comprise a plurality of fingers engaging with the chassis.

6. The computer system as claimed in claim 5 wherein the flexible wings extend from edges of the body.

7. The computer system as claimed in claim 5 wherein the flexible wings extend from the body with a plurality of openings being defined neighboring the flexible wings, respectively.

8. The computer system as claimed in claim 7, wherein the flexible wings each have a plurality of slits therein.

* * * * *